(12) United States Patent
Michelmann et al.

(10) Patent No.: US 10,370,019 B2
(45) Date of Patent: Aug. 6, 2019

(54) STEERING WHEEL COVER

(71) Applicant: I.G. BAUERHIN GMBH, Gruendau (DE)

(72) Inventors: Jochen Michelmann, Gelnhausen (DE); Klaus Flittner, Johannesberg (DE); Martin Mueller, Bad Soden-Salmuenster (DE)

(73) Assignee: I. G. BAUERHIN GMBH, Gruendau (DE)

( * ) Notice: Subject to any disclaimer, the term of this patent is extended or adjusted under 35 U.S.C. 154(b) by 62 days.

(21) Appl. No.: 15/349,117

(22) Filed: Nov. 11, 2016

(65) Prior Publication Data
US 2017/0137050 A1   May 18, 2017

(30) Foreign Application Priority Data

Nov. 16, 2015 (DE) .................... 20 2015 007 837 U

(51) Int. Cl.
| | |
|---|---|
| B62D 1/04 | (2006.01) |
| B62D 1/06 | (2006.01) |
| G01D 5/24 | (2006.01) |
| H05K 9/00 | (2006.01) |

(52) U.S. Cl.
CPC ............ B62D 1/046 (2013.01); B62D 1/06 (2013.01); G01D 5/24 (2013.01); H05K 9/009 (2013.01)

(58) Field of Classification Search
None
See application file for complete search history.

(56) References Cited

U.S. PATENT DOCUMENTS

| | | | | |
|---|---|---|---|---|
| 4,631,976 A | * | 12/1986 | Noda ..................... | B62D 1/065 219/204 |
| 8,278,602 B2 | * | 10/2012 | Yoneyama ............. | B62D 1/065 219/204 |
| 2004/0267422 A1 | * | 12/2004 | Bossler .................... | B62D 1/06 701/41 |
| 2012/0326735 A1 | | 12/2012 | Bennett et al. | |
| 2014/0253151 A1 | * | 9/2014 | Kandler ................. | B62D 1/046 324/686 |

FOREIGN PATENT DOCUMENTS

| | | |
|---|---|---|
| DE | 20309603 U1 | 9/2003 |
| DE | 102009058138 A1 | 6/2011 |

* cited by examiner

*Primary Examiner* — Douglas X Rodriguez
(74) *Attorney, Agent, or Firm* — Robert W. Morris; Eckert Seamans Cherin & Mellott, LLC

(57) ABSTRACT

A steering wheel cover, having a circumferential length and a transverse width, comprises a plurality of layers that cover each other at least partially in projection. The layers include a lower electrically conductive shielding layer and an upper cover layer, between which are arranged, starting from the shielding layer, an insulation layer and at least one electrically conductive sensor layer. The shielding layer and/or the sensor layer has/have a conductor structure with conductors extending in the length and width directions of the steering wheel cover. The shielding layer and/or the sensor layer is/are electrically connected to connecting conductors of a connecting cable. The electrical connection is formed by a metal foil. The steering wheel cover serves to detect whether a driver's hand is on the steering wheel.

19 Claims, 6 Drawing Sheets

STEERING WHEEL COVER

BACKGROUND OF THE INVENTION

The present invention relates to a steering wheel cover having a multilayer structure adapted to be applied to a steering wheel of a motor vehicle. These steering wheel covers are used, by virtue of their construction, as part of an arrangement for detecting if a driver's hand is on the steering wheel by determining the impedance between an electrode within the steering wheel cover and the vehicle body by means of an evaluation unit.

Such a steering wheel cover has a multi-layered structure, which has in one plane a circumferential length and a cross-sectional (i.e., transverse) width. The circumferential length is associated with the outer circumference of a steering wheel rim to be covered with the steering wheel cover and the cross-sectional width is associated with the outer diameter, viewed in the cross-sectional direction of the steering wheel rim. The steering wheel cover has a multi-layered structure, wherein the layers cover each other, at least partially in projection.

The layer sequence comprises a lower, electrically conductive shielding layer pointing to the steering wheel core, followed, when viewed in the direction toward an upper cover layer associated with the outer steering wheel cover, by a shielding layer, an insulation layer and at least one electrically conductive sensor layer.

The shielding layer and/or the sensor layer have a conductor structure with conductors extending in the circumferential length and in the cross-sectional width; the shielding layer and the sensor layer are electrically connected to connecting conductors of a connecting cable.

DE 203 09 603 U1 describes a steering device, i.e., a steering wheel for a motor vehicle. The steering wheel has a sensor device, which is designed as a capacitive sensor element, which is located in the area of the steering wheel rim of the steering wheel. This sensor device serves the purpose of detecting the approach and/or contact of the steering wheel rim by a driver's hand by changing the capacitance of the sensor element in order to also determine if the hand of a vehicle occupant is completely or only partly on the steering wheel or is even only in the vicinity of the steering wheel and if the steering wheel is grasped by the complete hand or is only touched by individual fingers. The sensor device is covered by a steering wheel covering or a steering wheel casing made of a leather or plastic material and consists of a conductor arrangement, which may be designed as an electrically conductive wire wound around the steering wheel rim. This arrangement of conductors acts as a capacitive sensor device. The signals are captured by an electronic evaluation unit, which can be arranged in the central area of the steering wheel. The sensor device can also be constructed of a conductive network structure or flat ribbon conductors. In one embodiment, the steering wheel rim is divided into sections to enable a locally resolved detection. The conductor arrangement can also serve as a heating device.

DE 10 2009 058 138 A1 describes a method for producing a proximity sensor for a vehicle, which is intended for a steering wheel in a vehicle. This proximity sensor has an upper fabric layer with conductive warp threads incorporated therein, a lower fabric layer with conductive weft threads incorporated therein, and a central fabric layer of non-conductive threads, which isolates the upper from the lower fabric layer. The upper and the lower fabric layer are each connected to an evaluation unit via a connector. The total capacity of this arrangement is comprised of the capacity of the three fabric layers, as well as a capacity that varies with the distance of a finger or a hand from the arrangement.

DE 10 2011 084 903 A1 focuses on sensor systems for a motor vehicle that can also be installed in a steering wheel, which also includes a heating device, with a capacitive sensor element that is intended to avoid or minimize interference due to parasitic capacities. In the arrangement of this sensor element on the steering wheel rim of a steering wheel, which can also be heated, wherein the steering wheel rim is constructed from a metal skeleton surrounded by a dielectric material, a heating layer is positioned on the dielectric material, which is covered on the outer side by a shielding layer, followed by a sensor layer, which in turn is surrounded by a cover of the steering wheel. A heating conductor and/or a sensor conductor of the capacitive sensor element can be designed as sewing threads. A metal mesh that is formed by warp and weft wires can be used for the shielding layer.

Another sensor system for a steering wheel of a vehicle is described in US 2012/0326735 A1 and has a first sensor, which is arranged inside a left, front section of the steering wheel in order to detect a contact of the left front section of the steering wheel, and has a second sensor, which is arranged inside the right front section of the steering wheel in order to detect a contact of the right, front section of the steering wheel separated from the first section. Furthermore, a third sensor is provided that is associated with the back of the steering wheel to capture contact of the rear section of the steering wheel. Touching of the respective section associated with the three sensors by the hand of a driver can be detected, whereby a driver's touch that does not take place with the hand can also be distinguished. Complex impedance sensors can be used as the sensors.

DE 203 09 877 U1 is directed to a vehicle safety system in which at least one capacitive sensor, preferably a plurality of sensors, is/are integrated into the steering wheel rim of a steering wheel. A change in an electrical or electromagnetic field is detected via sensors. The sensors are located between the wrapping, for example, PUR foam around a steering wheel skeleton, and a wrapping closing the steering wheel to the outside in the form of a flexible layer of foam, or leather or wood wrapping. The sensors can also be formed by at least a section of a steering wheel heater. When several sensors are used, conclusions can be drawn about the position of the upper body or the head of a driver relative to the steering wheel's axis of rotation. The sensors can be built as a flexible mat with elongated electrical conductors integrated therein. Such a sensor can also contain a nonwoven mat.

SUMMARY OF THE INVENTION

The principle object of the present invention is to provide a steering wheel cover with a sensor arrangement that is particularly well suited for a steering wheel due to its structure and/or the material used for this device.

This objective, as well as other objectives which will become apparent from the discussion that follows, are achieved, according to the present invention, by providing a steering wheel cover in which the electrical connection of the respective connecting conductors of the connecting cable is formed with the shielding layer and/or the sensor layer via a respective metal foil. By using a metal foil, in the area of which an electrical connection of a connecting cable to the respective shielding layer or sensor layer is established, an electrical contact of these layers is ensured. Despite this achievable extensive contact area, the metal foil does not build up under the cover of the steering wheel, in particular of the steering wheel rim, and thus does not show through the steering wheel cover on the outside thereof. Preferably, the contacting section with the metal foil is arranged in the spoke section of the steering wheel. Also for mounting this steering wheel cover on a steering wheel rim, the metal foil is characterized by its compliance in order to adapt it to the rounding of the steering wheel rim. The size of this metal foil is selected preferably such that its length and/or width corresponds to at least the triple spacing of the adjacent, non-conductive warp threads. According to another, independent inventive idea, the invention is also characterized in that the shielding layer and/or the sensor layer has/have a woven structure with non-conductive, stitch-forming warp threads and conductive weft threads. The weft threads should contain at least one conductive material. This design of the steering wheel cover also has the advantage that it can adapt to the steering wheel rim at any point to which it is applied, in particular with regard to the fact that due to the woven structure of the shielding layer and/or the sensor layer it has a good stretching behavior both in the circumferential length and the cross-sectional width, viewed in the development and thus viewed in the circumferential direction of the steering wheel rim as well as in the direction of the cross-section of the steering wheel rim.

In one embodiment, the metal foil covers several conductors of the respective conductor structure of the shielding layer or the sensor layer, wherein here too preferably the length or the width of the metal foil is at least triple the spacing of the adjacent, non-conductive warp threads. The dimensions of the metal foil can also be dimensioned with respect to their length and/or their width at a stitch spacing of stitches with which conductive threads are held on a carrier material in the shielding layer and/or the sensor layer; the respective dimension is then at least five times the stitch distance of the conductive thread.

The metal foil can also be connected to the conductors of the respective conductor structure by means of electrically conductive adhesive. Such a conductive adhesive penetrates into the structure of the shielding layer or the sensor layer and achieves additional contact areas between the electrically conductive conductors of the conductor structure.

For good accessibility of the connection area of the shielding layer and/or the sensor layer, the same are extended in the area, where they are connected to the connecting conductors of the connecting cable, such that they have the shape of a loop. This loop can be positioned in the steering wheel cover that is pulled around to the steering wheel core such that it can be oriented or guided in the area of a spoke of the steering wheel in the direction of the area of the steering wheel hub. The loop can be designed in a rectangular shape. However, the loop can also be designed with a trapezoidal outer contour or an oval outer contour, such that it becomes narrower towards its free end. The loop may have a length to width ratio of 10:1 to 1:10; preferably the loop has only a small length but a large width along which it is connected to the main surface, such that a length to width ratio of 1:10 to 2:5 should be maintained.

The connecting cable can be designed as a coaxial cable with an inner conductor and a coaxial cable shield and an outer protective sheath. With this coaxial cable, the inner conductor forms the connecting conductor connected to the sensor layer and the cable shield forms the connecting conductor connected to the shielding layer. On account of the coaxial cable, external interferences, which can act on the connecting conductors due to the environment, are avoided or at least largely suppressed.

The shielding layer and/or the sensor layer can be made of a conductive textile that adapts to the circumstances, e.g., the shape of the steering wheel core. Such a conductive textile can have metalized textile fibers. Fibers of silver-plated PA66 thread are provided for this, with a resistance of fewer than 500 ohms/m. Also possible are fibers with a resistance of fewer than 1000 ohms/m. In one other embodiment, the conductive textile can contain wires made of metal and/or metal alloy as the conductive fibers.

The sensor layer and the shielding layer with the insulation layer between them are dimensioned and spaced from each other such that they form a capacitor with a capacity of at least 100 pF. The insulation layer should be designed such that the sensor layer is located above the shielding layer and does not penetrate into the latter, so as to achieve complete shielding of the steering wheel rim.

For the sensor layer to be completely shielded against external influences, the sensor layer is dimensioned such that its surface area is smaller than that of the shielding layer. Here, the sensor layer in projection on the shielding layer should be smaller than the shielding layer, at least on one side, viewed in cross-sectional width, i.e. in the direction of the cross-sectional circumference of the steering wheel rim.

For the textile material to be particularly well suited for wrapping and the intended use, it is structured such that weft threads of the textile material extend between warp threads of the textile material, i.e., in such a way that each weft thread is in electrical connection with at least the next adjacent weft thread. Such a material is characterized by its excellent stretching behavior and low material usage.

With one other textile material, which for certain purposes is considered preferred, the conductive weft threads extend between adjacent, non-conductive, spaced warp threads. Here, the warp threads can be processed into the respective textile layer in jersey technique or fringe technique.

Polyester is provided as the material for the warp threads. The distance between adjacent warp threads can be in the range of 1 to 10 mm, with a distance in the range of 3 to 5 mm being preferred. Materials made of PA6.6 (polyimide 6.6) are preferably used as the material for the weft threads, which exhibit very good mechanical properties in terms of stiffness and hardness, abrasion, strength and heat distortion resistance, with a metallic layer, preferably a silver coating. The conductivity of the weft threads should be fewer than 500 ohms/m. The weft threads are processed preferably such that a medium distance of adjacent weft threads, viewed in the direction of the extension of the warp threads, is between 0.5 and 1.5 mm.

At least two types of weft threads are used in a further embodiment; they are each made of different electrically conductive materials. In a textile in which the weft threads run in a meandering manner between at least two adjacent warp threads, the weft threads of different conductivity alternate between adjacent warp threads. The weft threads of one conductivity can extend meander-shaped between up to 10, preferably up to 5, adjacent and essentially parallel warp threads, before weft threads of the other conductivity extend between subsequent warp threads. Accordingly, a weft thread can span several warp threads. The meanders of each weft thread can have an average spacing of 0.5 to 1.5 mm, viewed in the direction of the course of the warp threads. A section of weft threads having these distances can alternate with an adjacent section in which the meanders of the weft threads have an average spacing of 1.5 to 10 mm. If the distances of the weft threads of adjacent sections alternate in this fashion, the materials of the weft threads of the respective sections can also be the same. The resistance value of individual surface regions of the conductive textile can be adjusted by way of the different materials of the weft threads and/or by the different distances of the meanders of the weft threads and/or by the number of warp threads across which the respective weft threads extend.

In one further embodiment, the weft threads have metalized plastic fibers.

In one further embodiment, the weft threads have wires made of metal or of a metal alloy.

Copper is the preferred material of the metal foil; the thickness of the metal foil should be in the range of 10 to 200 µ2m, preferably in the range of 10 to 100 µm. In one particularly preferred embodiment, the sensor layer and/or the shielding layer can be made of a metal foil, which is structured through cuts such that it can be stretched in at least one direction of its area. Such a metal foil should also have a thickness in the range of 10 to 200 µm, with a preferred thickness of 10 to 100 µm. For a metal foil that is suitable in regard to material and thickness, this stretchability can also be achieved by having an embossed structure with embossments in a direction perpendicular to the base surface of the metal foil that flatten toward the base of the metal foil when the foil is stretched. The thickness of such an embossed metal foil is also in the range of 10 to 200 µm or 10 to 100 µm. Structuring of the metal foil can also be carried out by etching, where the aforementioned cuts in the material of the metal foil are etched.

In order to secure the respective layers in their positioning relative to one another, an adhesive material can be used which connects the layers at least in points. A double-sided adhesive layer, for example, a double-sided adhesive tape, can be used as an adhesive material for securing the layers in their position. Furthermore, a nonwoven adhesive or a hot melt adhesive is also intended.

A polyurethane (PU) foam, an elastomeric terpolymer, a nonwoven or a foil can be used as the material for the cover layer. The material used is matched to the haptics to be achieved on the steering wheel. A cover layer of polyurethane (PU) foam is preferable if a soft touch is desired. An elastomeric terpolymer (rubber) is among others an EPDM (ethylene propylene diene monomer). EPDM and EPM (ethylene propylene monomer) have the advantage that they are water-resistant and highly flexible, even at cold temperatures, while a harder haptic is achieved with a nonwoven material as a cover layer. Using a foil can prevent moisture from penetrating the cover layer or only adjust such penetration.

An elastomeric terpolymer (rubber), a nonwoven, a foil, a foamed rubber or a PU foam, preferably of a closed porous foam can be used as the material for the insulation layer. In any case, it must be ensured that the insulation layer is primarily electrically insulating. If a foil material is used for the cover layer, it should have a thickness of 10 µm to 200 µm, preferably of 20 µm to 50 µm.

For additionally securing and for optimizing the conductivity, at least one electrically conductive adhesive tape can be positioned between the insulation layer and the sensor layer and/or between the insulation layer and a shielding layer. This measure also achieves that a larger area of the respective layer is additionally spanned by the cover. The conductivity of the respective adhesive layer should preferably be in the range of less than 50 kOhm/square.

In order to achieve the same material behavior, in particular an identical stretching behavior, with respect to the shielding layer and the sensor layer, an essentially identical construction, which also relates to the structure of these layers, is selected for the shielding layer and the sensor layer.

To obtain an even more consistent conductivity of the shielding layer and/or the sensor layer, they can additionally have conductive graphite or metal particles, which can be embedded in the layers.

If the steering wheel rim of the steering wheel is to be heated and thus an additional heating layer is to be integrated in the steering wheel cover, an additional insulation layer is arranged in the direction of the steering wheel core and separates the heating layer from the other layers, i.e., the shielding layer and the sensor layer.

For a full understanding of the present invention, reference should now be made to the following detailed description of the preferred embodiments of the invention as illustrated in the accompanying drawings.

DETAILED DESCRIPTION OF THE PREFERRED EMBODIMENTS

Figure 1:
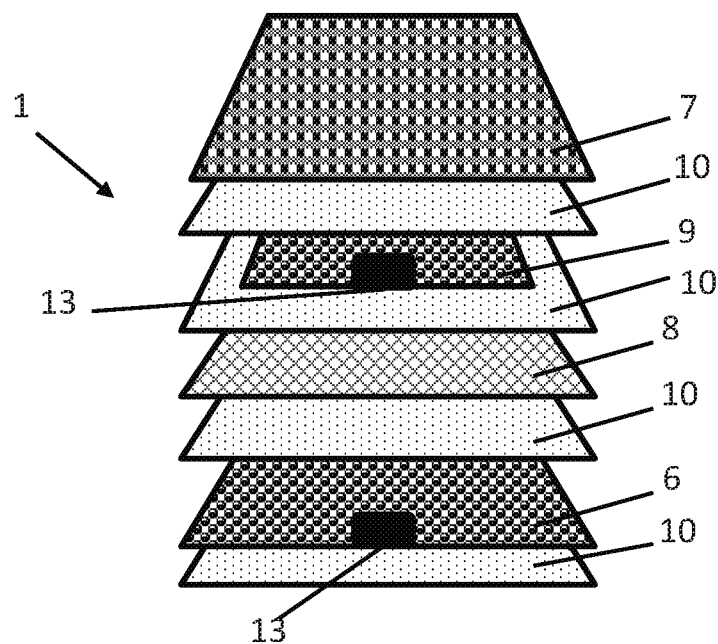
FIG. 1 is a schematic, perspective, exploded view of a layer structure for a steering wheel cover according to the present invention.

The preferred embodiments of the present invention will now be described with reference to FIGS. 1-6 of the drawings. Identical elements in the various Figures are designated with the same reference numerals.

Figure 2:
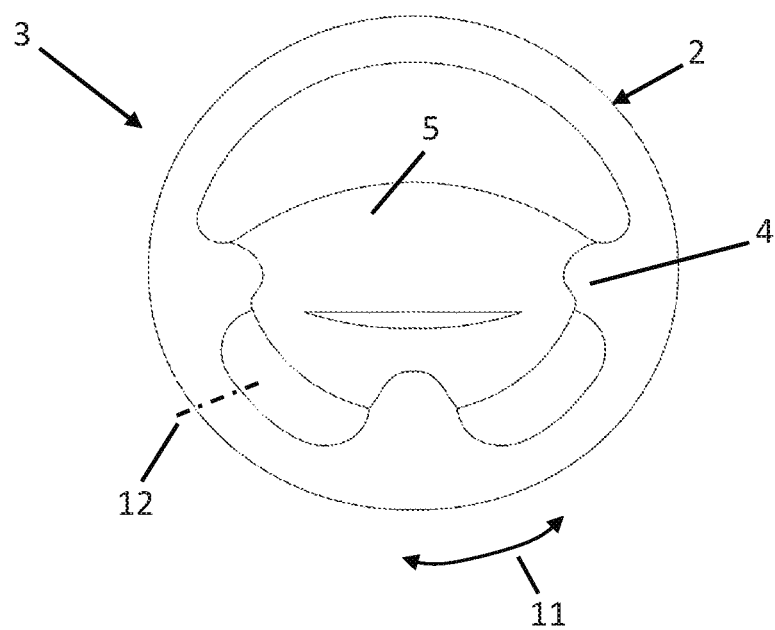
FIG. 2 is a plan view of a steering wheel with the steering wheel cover applied.

The steering wheel cover 1, as presented in FIG. 1, has a multi-layered structure. This steering wheel cover 1 is arranged on a steering wheel rim 2 of a steering wheel 3, which is shown in FIG. 2. Such a steering wheel rim 2 is secured to a steering wheel hub in the area of a central impact absorber 5 via steering wheel spokes 4.

The steering wheel cover 1 includes a bottom shielding layer 6, which is oriented towards a steering wheel core of the steering wheel rim 2, and a top cover layer 7 that points to a not shown steering wheel cover.

An insulation layer 8 and a sensor layer 9 are located between the shielding layer 6 and the cover layer 7 of the steering wheel cover 1, viewed from the shielding layer 6 in the direction of the cover layer 7 and thus in the direction of the not shown steering wheel cover. One adhesive layer 10 each is arranged between the shielding layer 6 and the insulation layer 8 as well as between the insulation layer 8 and the sensor layer 9 and the sensor layer 9 and the cover layer 7, for which a double-sided adhesive material layer, comparable to a double-sided adhesive tape, is preferably used.

Based on FIG. 1, it can be seen that the sensor layer 9 has a surface area that is smaller than the surface area of the shielding layer 6 such that the shielding layer 6, viewed in projection on the sensor layer 9, covers this sensor layer 9 in such a way that an edge region of the shielding layer 6 remains on all four sides, however, at least on three sides or two sides. This remaining edge is also clearly recognizable by the fact that the adhesive layer 10, which is inserted between the insulation layer 8 and the sensor layer 9 and which corresponds in size to the size of the insulation layer 8 and the size of the shielding layer 6, has an adhesive strip which is not covered by the sensor layer 9.

In principle, the surface dimensions of the individual layers 6, 7, 8 and 10 are selected in such a way that they are essentially superimposable, while only the sensor layer 9 is smaller in its dimensions. This means that the individual layers 6, 7, 8 and 10 have a circumferential length and a cross-sectional width in their development in such a way that these layers at least partially overlap one another in projection on one another. The circumferential length of the layers arises from the outer circumference of the steering wheel rim 2 of the steering wheel 3 in FIG. 2, which is designated with the circumferential arrow 11, while the cross-sectional width corresponds to the circumference of the cross-section of the steering wheel rim 2 in FIG. 2 designated with the reference sign 12.

Figure 3:
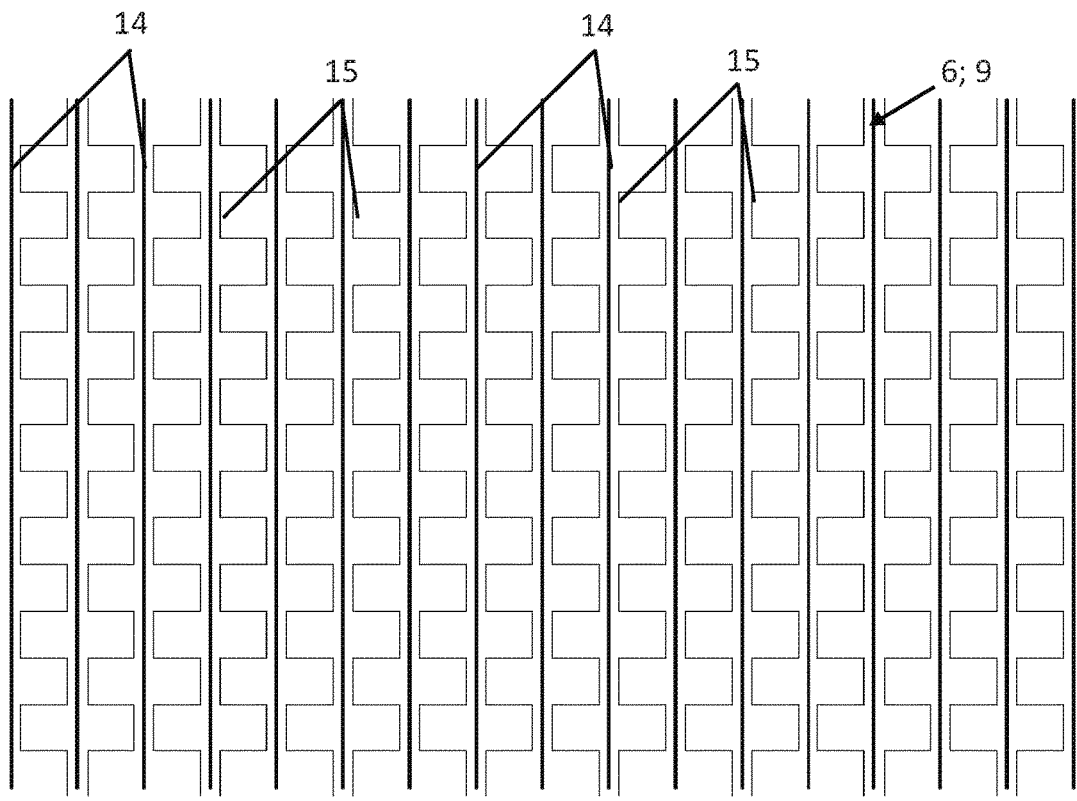
FIG. 3 shows one design for a conductor structure of the sensor layer or the shielding layer of the steering wheel of FIG. 1.
Figure 4A:
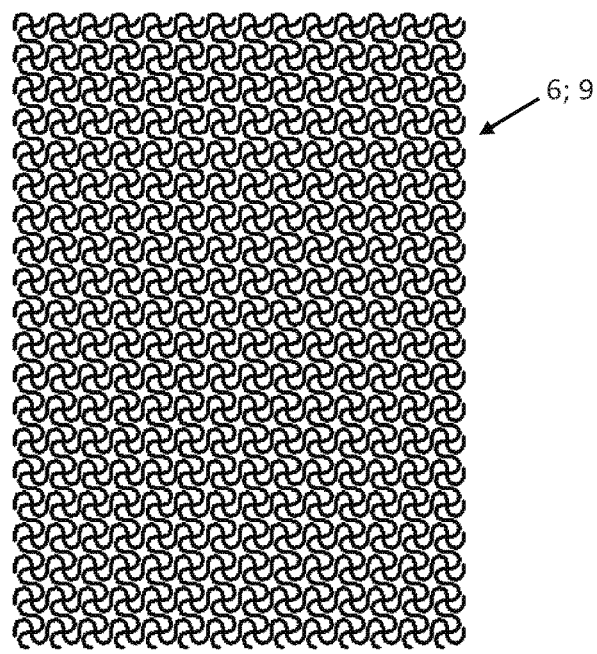
FIGS. 4a to 4d show various sections of differently structured metal foils that can be used for the shielding layer or the sensor layer of the steering wheel of FIG. 1.
Figure 4B:
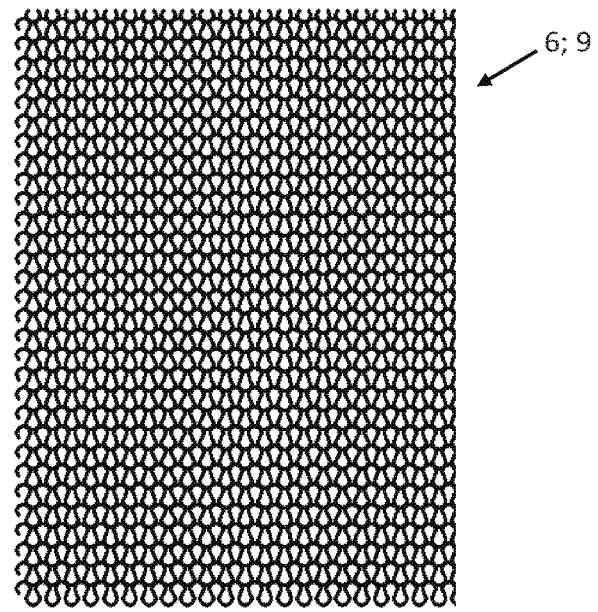
Figure 4C:
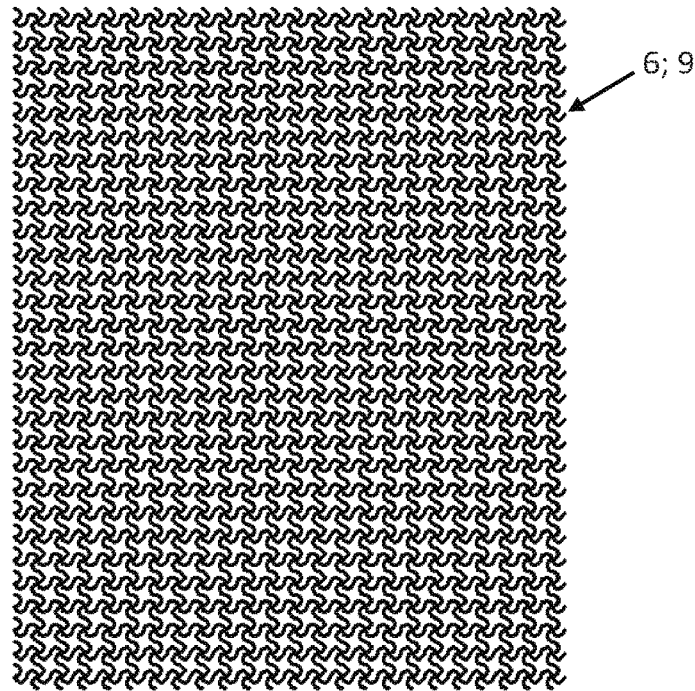
Figure 4D:
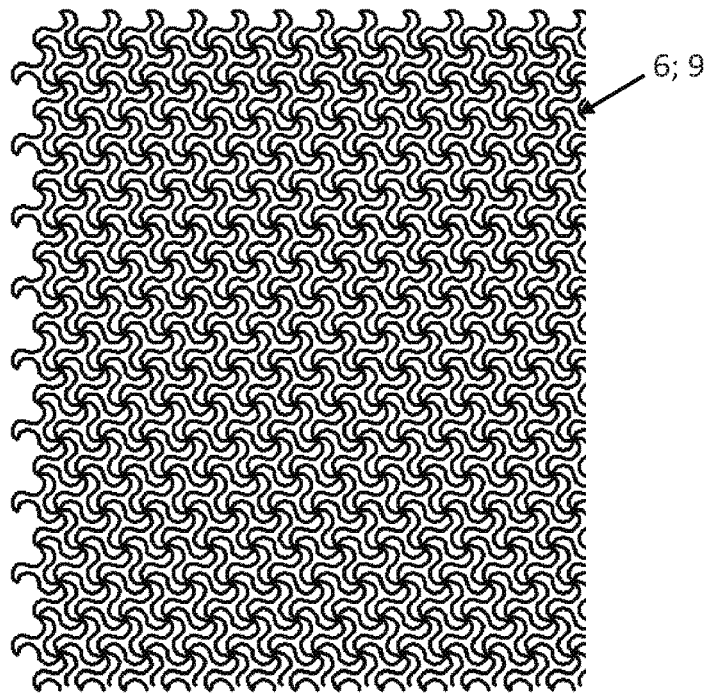

The shielding layer 6 and/or the sensor layer 9 is/are built of a conductor structure, which is shown in FIG. 3, for example. Preferably, they consist essentially of a conductive knitted fabric. A thin layer of PU foam (polyurethane foam), a nonwoven fabric with a high compressive hardness or a foil is used as the material for the cover layer 7. Among other things, the cover layer 7 is intended to prevent parts of the underlying layers from showing through a steering wheel cover.

A PU foam mat (polyurethane foam mat) is used for the insulation layer 8, which insulates the shielding layer 6 sufficiently against the sensor layer 9. A foil or a nonwoven, for example, corresponding to the material of the cover layer 7, can also be used as the insulation layer 8. A structure in which the cover layer 7 and the insulation layer 8 are identical with respect to the material used is preferred; especially in such a structure, the cover layer 7 can be somewhat thicker than the insulation layer 8, preferably a cover layer 7 being twice as thick as the insulation layer 8.

In the shown layer structure of the steering wheel cover 1 of FIG. 1, a connection region 13 is indicated on the shielding layer 6 as well as on the sensor layer 9, in the area of which a connecting conductor of a connecting cable is electrically connected to the respective conductor structure. Each of these connection regions 13 is located on the edge of the respective layers 6 and 9.

The connection areas 13 of the respective layers 6 and 9 can be arranged laterally offset viewed in projection onto each other such that the thickness of the overall construction does not substantially increase when a connecting cable is connected, and also a simpler assembly of the respective connecting cables is possible.

If offset positioning of the connection areas 13 of the respective layers 6 and 9, viewed in projection onto each other, is not possible for reasons of space, then an arrangement of the connection areas 6 and 9 viewed in projection onto each other is possible above each other, as shown in FIG. 1.

FIG. 3 shows a structure of a conductor structure of the sensor layer 9 or of the shielding layer 6 with warp threads 14 that are essentially parallel to each other made of a non-conductive material between which electrically conductive weft threads 15 extend. The weft threads 15 that extend between two warp threads 14 are in contact with the weft threads 15 on the other side of the respective warp thread 14 or worked into the layer such that they are electrically connected to each other. A silver-plated thread, i.e., one with a silver surface coating can be used as the material for the conductive weft threads 15. The resistance of the thread for the conductive weft threads 15 is preferably between 500 Ohm/m and 1000 Ohm/m; where possible, threads with the smaller values should be used.

The warp threads 14 and the weft threads 15 are processed in fringe binding. The warp threads 14 and the weft threads 15 are also intended to be processed in jersey binding. Using both techniques, a pattern of the warp threads 14 and of the weft threads 15 can be achieved that is schematically illustrated in FIG. 3.

Figure 5:
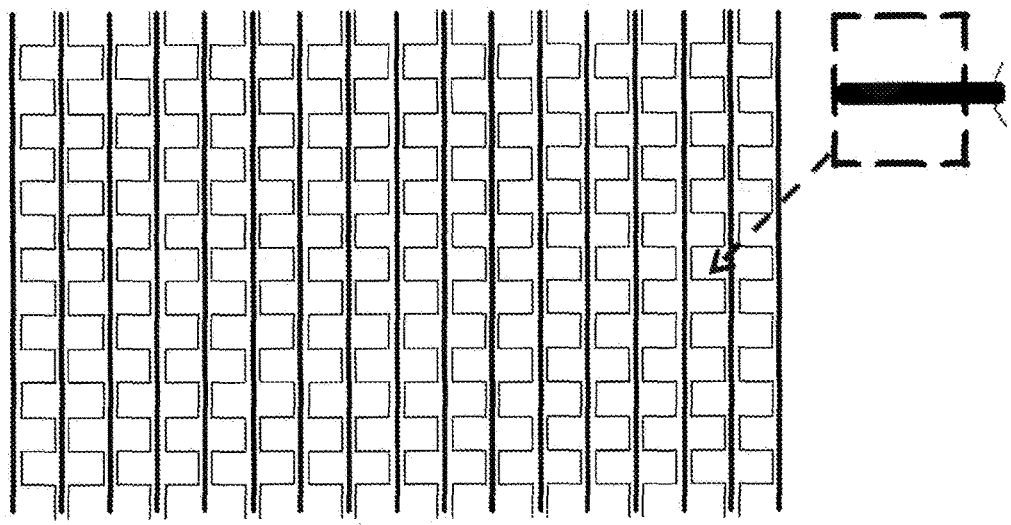
FIG. 5 shows a section of a sensor layer or shielding layer, such as that also shown in FIG. 3, with a section of a metal foil that is used to contact the sensor layer or the shielding layer to connect the conductor of a connecting cable.
Figure 5:
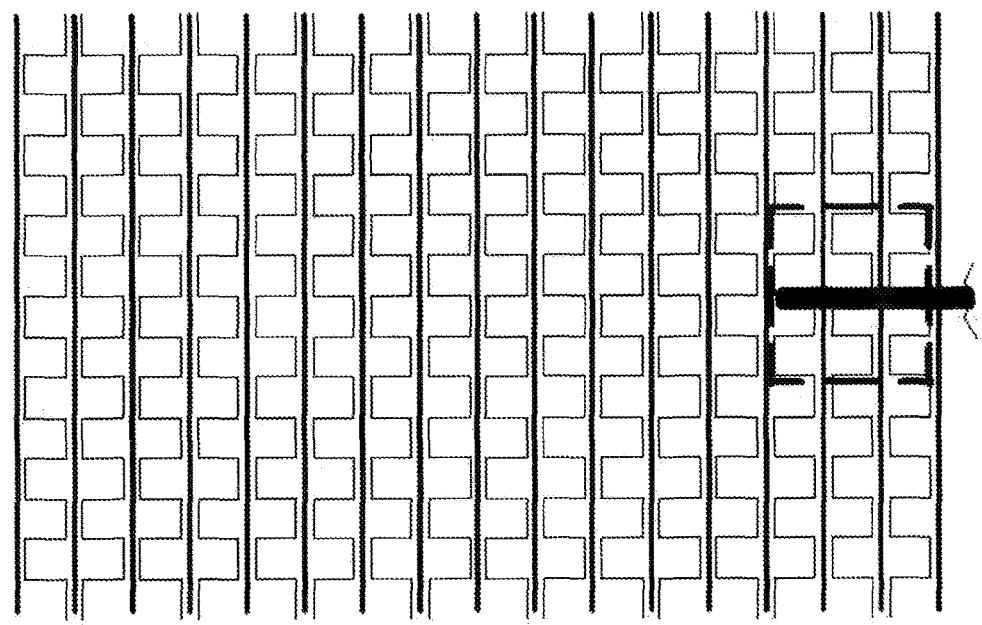
Figure 6:
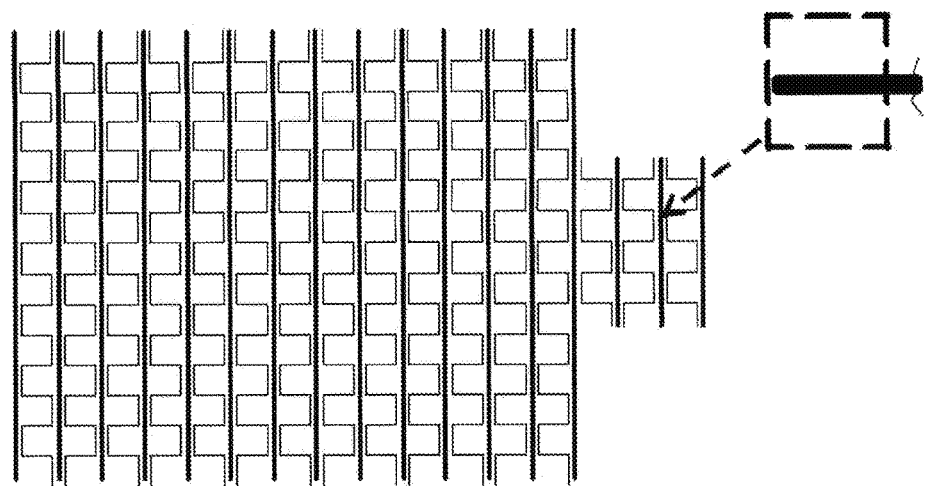
FIG. 6 is a view, similar to FIG. 5, in which a loop is provided.
Figure 6:
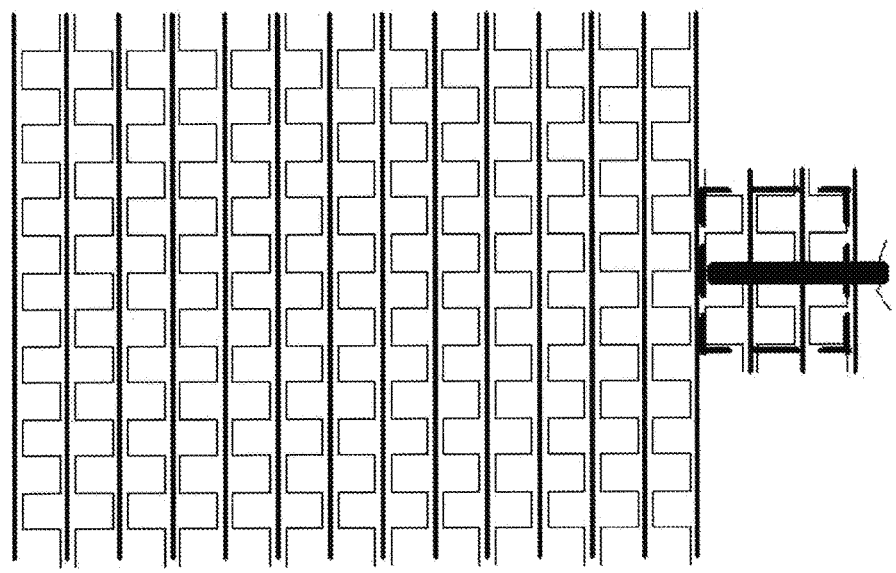

FIGS. 5 and 6 show a section of a conductor structure comparable to that shown in FIG. 3. The individual conductors can represent warp threads 14 and weft threads 15 in this conductor structure as well. However, the conductor structure can also be assigned to a different structure of the shielding layer 6 and the sensor layer 9 since FIGS. 5 and 6 serve the purpose of connecting the layer of the conductive structure to a connecting conductor 16 of a connecting cable.

According to FIG. 5, the connecting conductor 16 is connected to the conductor structure such that it covers several conductors, for example a section that extends over at least three warp threads 14 when the conductor structure of FIG. 5 is assigned to both warp threads 14 and weft threads 15 extending therebetween. The connecting conductor 16 extends preferably such that it is essentially arranged orthogonally to the course of the warp threads 14. As a result, it is in electrical connection to the weft threads 15, which extend between these warp threads 14. In addition, in one embodiment, a metal foil is applied to the conductor structure indicated by a rectangle in a dashed line 17 in the connection region as described above. This metal foil 17 assigned to the rectangle ensures a larger contacting area of the electrically conductive structures of the shielding layer 6 or the sensor layer 9 and connects this region to the connecting conductor 16. In one embodiment, the connecting conductor 16 is attached and electrically connected to the outer side of the metal foil 17, i.e., to the side facing away from the conductor structure. However, the connecting conductor 16 can also be interposed between the metal foil 17 and the conductor structure, in particular when the connecting conductor 16 is designed as a thin, flat conductor track; this conductor track can consist of a copper foil, from which the metal foil 17 can also be built. Such a metal foil 17 can additionally be coated, for example vapor-plated, with a silver layer.

In contrast to the structure of FIG. 5, the connection with the connecting conductor 16 is made on a loop 18, which is formed from a loop-shaped section of the shielding layer 6 or of the sensor layer 9. Consequently, this loop 18 preferably has a conductor structure or a material structure corresponding to the further surface of the respective layer 6 or 9. This loop 18 can also be covered by a metal foil 17 according to the embodiment of FIG. 5, with the advantages described above with reference to FIG. 5. This refers also to the size of the metal foil 17 and thus also to the size of the loop 18. However, the metal foil 17 can also cover a part of the edge of the main surface of the respective layer and thus of the conductor structure such that it imparts additional strength to the loop 18 and the connection of the loop 18 to the further conductor structure of the shielding layer 6 and sensor layer 9.

In addition to the metal foil 17, but optionally also as an alternative to the metal foil 17, a conductive adhesive tape can be applied in an area that corresponds, for example, to the dashed line 17 in FIGS. 5 and 6, in order to additionally connect a plurality of conductors of the conductive conductor structure to one another and to achieve an even larger contact surface with the metal foil 17. The connecting conductor 16 can also be secured to the mat via a cover made of a nonwoven or a hot glue. The connecting conductor 16 can also be installed and secured in the area of the connecting surface (dashed line 17 in FIG. 5 or in FIG. 6) in one or more loops in order to achieve additional strain relief of the contact regions.

In further embodiments, the supply line and the connecting conductor 16 are soldered, welded or preferably fastened with a crimp connection in the connection region. A coaxial cable should be used for the connecting conductor 16 of the shielding layer 6 and the connecting conductor 16 of the sensor layer 9 in order to avoid interferences.

FIGS. 4a to 4d show different sections of differently structured metal foils that can be used for the shielding layer. These metal foils have punch lines in the form of meanders, star-shaped rays, and the like, particularly in the form of Greek meanders or Greek double meanders, such that continuous, i.e., connected to each other, metal structures remain. Such metal foils show a stretching behavior and thus a flexibility such that they are well adapted to their environment on the steering wheel 2.

It should be noted that the features described in the present document, as far as they relate to one embodiment, can also be transferred to other embodiments without this being explicitly mentioned. Individual features of a particular embodiment can also be combined with individual features of another embodiment.

There has thus been shown and described a novel steering wheel cover which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. A steering wheel cover with a multilayer structure, which has a circumferential length and a cross-sectional width, said structure comprising a plurality of layers that cover each other at least partially in projection, with a lower electrically conductive shielding layer and an upper cover layer, between which are arranged, starting from the shielding layer, an insulation layer and at least one electrically conductive sensor layer, wherein at least one of the shielding layer and the sensor layer comprises a conductor structure with conductors extending in the length and width directions of the steering wheel cover, wherein at least one of the shielding layer and the sensor layer are electrically connected to connecting conductors of a connecting cable forming an electrical connection, and wherein the electrical connection of the respective connecting conductors of the connecting cable with the conductor structure of said at least one of the shielding layer and the sensor layer, respectively, is formed by a metal foil, the metal foil being coupled to the respective conductor structure of at least one of the shielding layer and the sensor layer.

2. A steering wheel cover as in claim 1, wherein at least one of the shielding layer and the sensor layer has a knitted structure with non-conductive, stitch-forming warp threads and conductive weft threads.

3. A steering wheel cover as in claim 2, wherein the weft threads extend between warp threads, and wherein each weft thread is connected electrically to at least the nearest adjacent weft thread.

4. A steering wheel cover as in claim 2, wherein the conductive weft threads are located between adjacent spaced warp threads.

5. A steering wheel cover as in claim 1, wherein the metal foil covers multiple conductors of the respective conductor structure of at least one of the shielding layer and the sensor layer, respectively, and wherein the metal foil is connected to the conductors of the respective conductor structure by means of an electrically conductive adhesive.

6. A steering wheel cover as in claims 1, wherein at least one of the shielding layer and the sensor layer is formed of a conductive textile.

7. A steering wheel cover as in claim 6, wherein the conductive textile has metalized textile fibers.

8. A steering wheel cover as in claim 1, wherein the sensor layer and the shielding layer form a capacitor with a capacitance of at least 100 pF together with the insulation layer therebetween.

9. A steering wheel cover as in claim 1, wherein the sensor layer has a smaller area than does the shielding layer.

10. A steering wheel cover as in claim 1, wherein at least a portion of the respective layers is secured via an adhesive material in their positions with respect to each other.

11. A steering wheel cover as in claim 1, wherein the cover layer is made of a material selected from the group consisting of a PU foam, an elastomeric terpolymer, a nonwoven and a foil.

12. A steering wheel cover as in claim 11, wherein the PU foam has a closed surface layer.

13. A steering wheel cover as in claim 1, wherein the insulation layer is made of a material selected from the group consisting of an elastomeric terpolymer, a nonwoven, a foil, a foamed rubber and a PU foam.

14. A steering wheel cover as in claim 1, further comprising an additional insulation layer arranged underneath the shielding layer in the direction of a core of a steering wheel when the steering wheel cover is applied thereto.

15. A steering wheel cover as in claim 1, wherein at least a portion of the respective layers is secured via an adhesive material in their positions with respect to each other.

16. A steering wheel cover as in claim 1, wherein the cover layer is made of PU foam, an elastomeric terpolymer, a nonwoven or a foil.

17. A steering wheel cover as in claim 1, wherein the insulation layer is made of a material elected from the group consisting of an elastomeric terpolymer, a nonwoven, a foil, a foamed rubber and a PU foam.

18. A steering wheel cover as in claim 17, wherein the PU foam has a closed surface layer.

19. A steering wheel cover as in claim 1, further comprising an additional insulation layer arranged underneath the shielding layer in a direction of a steering wheel core.

* * * * *